United States Patent
Huang (10) Patent No.: US 11,758,266 B2
(45) Date of Patent: Sep. 12, 2023

(54) IMAGE SYSTEM ON CHIP, IMAGE CAPTURING SYSTEM INCLUDING THE SAME, AND IMAGE CAPTURING METHOD

(71) Applicant: REALTEK SEMICONDUCTOR CORPORATION, Hsinchu (TW)

(72) Inventor: Yuchen Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/467,941

(22) Filed: Sep. 7, 2021

(65) Prior Publication Data

US 2022/0264001 A1    Aug. 18, 2022

(30) Foreign Application Priority Data

Feb. 18, 2021   (TW) .................................. 110105536

(51) Int. Cl.
*H04N 23/60*   (2023.01)
*H01L 27/12*   (2006.01)
*H04N 23/65*   (2023.01)

(52) U.S. Cl.
CPC ............. *H04N 23/64* (2023.01); *H01L 27/12* (2013.01); *H04N 23/651* (2023.01)

(58) Field of Classification Search
CPC .......... H04N 5/23222; H04N 5/232411; H01L 27/12
See application file for complete search history.

(56) References Cited

U.S. PATENT DOCUMENTS

| | | | |
|---|---|---|---|
| 6,360,362 B1 | 3/2002 | Fichtner et al. | |
| 7,624,260 B2 | 11/2009 | Ethier et al. | |
| 7,932,929 B2 | 4/2011 | Wang | |
| 8,589,667 B2 | 11/2013 | Mujtaba et al. | |
| 9,170,823 B2 | 10/2015 | Ma et al. | |
| 9,426,357 B1 | 8/2016 | Campbell et al. | |
| 2011/0157460 A1* | 6/2011 | Kim .................. | H04N 5/232411 348/372 |
| 2020/0412972 A1* | 12/2020 | Kadambala ........ | H04N 5/23245 |

FOREIGN PATENT DOCUMENTS

| | | |
|---|---|---|
| TW | 528987 B | 4/2003 |
| TW | 200839569 A | 10/2008 |
| TW | 201214145 A | 4/2012 |

OTHER PUBLICATIONS

U.S. Pat. No. 6,360,362 corresponds to TW528987B.
U.S. Pat. No. 7,932,929 corresponds to TW200839569A.
U.S. Pat. No. 8,589,667 corresponds to TW201214145A.

* cited by examiner

*Primary Examiner* — Mekonnen D Dagnew
(74) *Attorney, Agent, or Firm* — WPAT, P.C., INTELLECTUAL PROPERTY ATTORNEYS; Anthony King (57) ABSTRACT

The present disclosure provides an image SoC, an image capturing system including the same, and an image capturing method. The SoC includes a memory and a controller. The controller is configured to: read process data stored in the memory; perform an image sensor initialized process to start an image sensor according to the process data and to control the image sensor to capture a first image; after performing the image sensor initialized process, perform a program loader to load an image processing program into a non-read only memory according to the process data; and perform the image processing program to receive the first image.

20 Claims, 10 Drawing Sheets

IMAGE SYSTEM ON CHIP, IMAGE CAPTURING SYSTEM INCLUDING THE SAME, AND IMAGE CAPTURING METHOD

CROSS REFERENCE TO RELATED APPLICATIONS

This application claims priority of Taiwan application No. 110105536 filed on Feb. 18, 2021, which is incorporated by reference in its entirety.

BACKGROUND

Field of the Invention

The present invention relates generally to a technique of image capturing, in particular, to an image system on chip, an image capturing system including the same, and an image capturing method.

Description of Related Art

In the conventional monitoring system, an image capturing device is mainly used to complete the image capturing action to achieve the purpose of surveillance or security. In recent years, in order to save power, the image capture devices often enter a sleep mode or turn off the sensor when they are idle and wake or activate the sensor from the sleep mode after the event is triggered. However, this type of operation is likely to cause a delay in the time to capture the first image.

BRIEF SUMMARY OF THE INVENTION

Some embodiments of the present invention provide an image capturing method. The method includes: reading a process data stored in a memory; performing an image sensor initialized process to start an image sensor according to the process data, and controlling the image sensor to capture a first image; performing a program loader according to the process data, after performing the image sensor initialized process, to load an image processing program into a first non-read-only memory; and performing the image processing program to receive the first image.

Some embodiments of the present invention provide an imaging system on chip (SoC). The image SoC includes a memory set and a controller set. The memory set and the controller set are electrically connected. The memory set is configured to store a process data. The controller set is configured to: read the process data; perform an image sensor initialized process to start an image sensor according to the process data, and controlling the image sensor to capture a first image; perform a program loader according to the process data, after performing the image sensor initialized process, to load an image processing program into a first non-read-only memory; and perform the image processing program to receive the first image.

Some embodiments of the present invention provide an image capturing system. The image capturing system includes an image sensor and an image SoC. The image sensor and the image SoC are electrically connected. The image SoC includes a memory and a controller. The memory and the controller are electrically connected. The memory is configured to store a process data. The controller is configured to: read the process data; perform an image sensor initialized process to start the image sensor according to the process data, and control the image sensor to capture a first image; perform a program loader according to the process data, after performing the image sensor initialized process, to load an image processing program into a first non-read-only memory; and perform the image processing program to receive the first image.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Embodiments of the present invention are discussed in detail below. It should be appreciated, however, that the present invention provides many applicable inventive concepts that can be embodied in a wide variety of specific contexts. The specific embodiments discussed are merely illustrative and do not limit the scope of the disclosure.

When waking up or starting sensors of conventional image capture devices from a sleep mode, the time to capture the first image is often delayed because the operation takes too long. In order to reduce the time delay of capturing the first image so as to complete the capturing of the first image efficiently and quickly, the present disclosure provides an imaging system on chip (SoC) and an image capturing system including the same and an image capturing method.

Figure 1A:
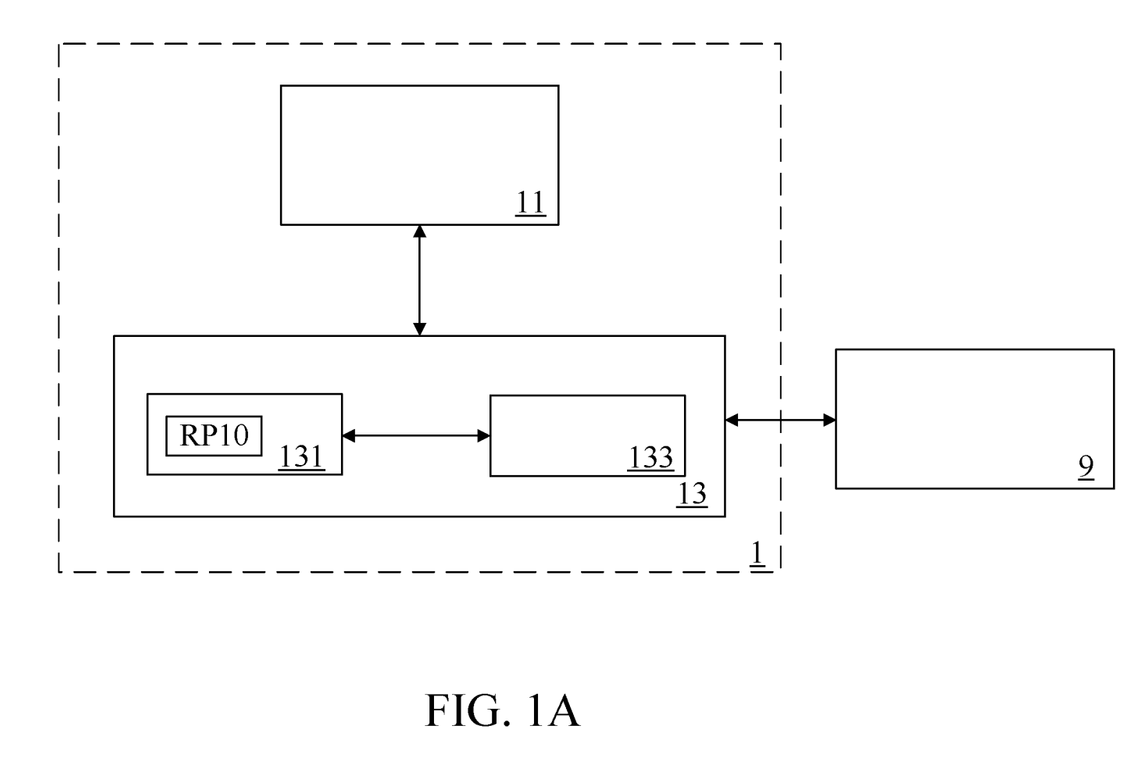
FIG. 1A is a block diagram illustrating an image capturing system 1 according to some embodiments of the present disclosure.

Please refer to FIG. 1A, which is a block diagram illustrating an image capturing system 1 according to some embodiments of the present disclosure. The image capturing system 1 includes an image sensor 11 and an imaging SoC 13. The imaging SoC 13 includes a memory (e.g., a read-only memory (ROM) 131) and a controller 133. The ROM 131 stores a process data RP10.

In some embodiments, the image sensor 11 and the imaging SoC 13 are electrically connected, and the ROM 131 and the controller 133 are electrically connected. In some embodiments, the imaging SoC 13 and a non-read-only memory 9 are electrically connected. Data and signals are transmitted between elements via the electrical connection. Related image capturing operations are discussed in detail below.

Figure 1B:
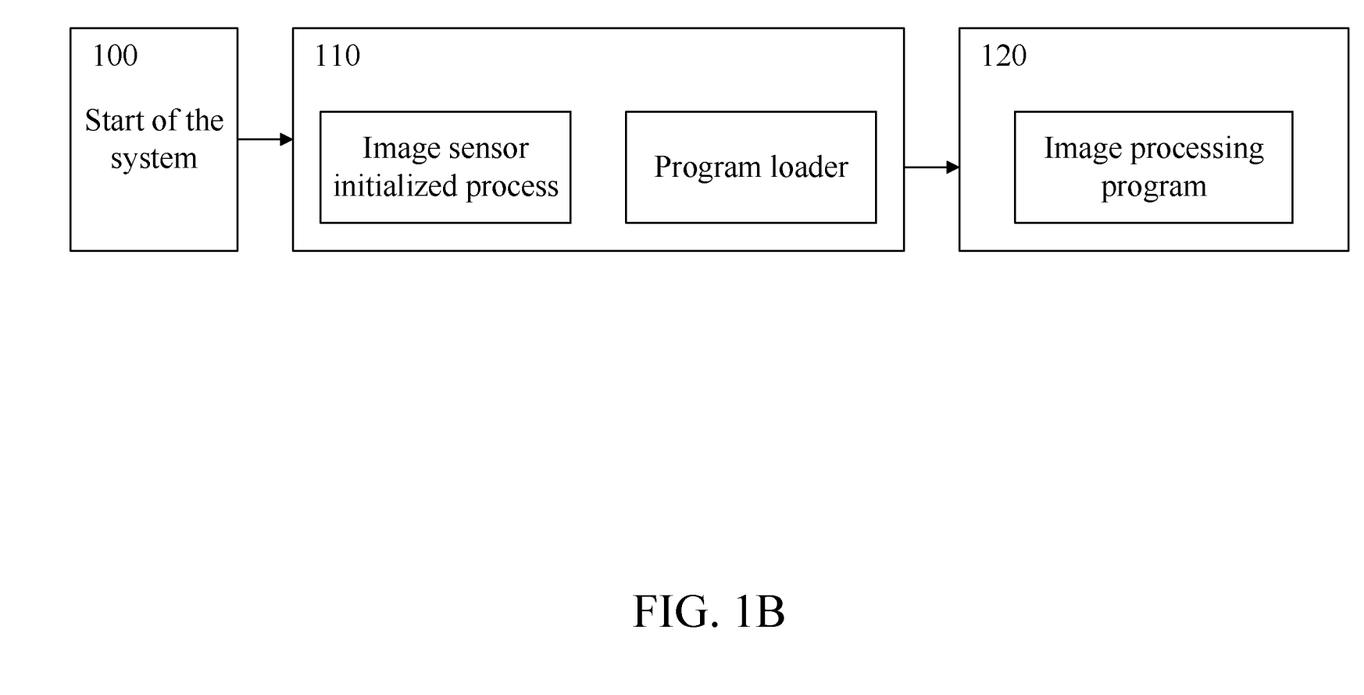
FIG. 1B is a schematic diagram showing the operation sequences of the image capturing system in different stages according to some embodiments of the present disclosure.

Please refer to FIG. 1B together. FIG. 1B is a schematic diagram showing the operation sequences of the image capturing system 1 in different stages according to some embodiments of the present disclosure. The block 100 represents the operations during "start of the image capturing system 1" stage, the block 110 represents the operations during "the processing of the process data RP10 stored in the ROM 131" stage, and the block 120 represents the operations during "the processing of the data loaded in the non-read-only memory 9" stage.

Specifically, in the stage of the block 100, the image capturing system 1 is started. When the image capturing system 1 is started, and it is intended to capture the image, it proceeds to the stage of the block 110, during which the controller 133 of the imaging SoC 13 reads the process data RP10 of the ROM 131. In some embodiments, the process data RP10 includes an image sensor initialized process and a program loader.

Next, the controller 133 of the imaging SoC 13 perform the image sensor initialized process according to the process data RP10 of the ROM 131, to start the image sensor 11, and controls the image sensor 11 to capture the first image. After performing image sensor initialized process, the controller 133 of the imaging SoC 13 performs the program loader according to the process data RP10 of the ROM 131, so as to load an image processing program into the non-read-only memory 9.

Thereafter, when the image processing program is loaded into the non-read-only memory 9, it proceeds to the stage of the block 120, during which the controller 133 of the imaging SoC 13 performs an image processing program to receive the first image. In this way, by performing the image sensor initialized process in advance during the procedures related to the process data RP10 stored in the ROM 131, it is feasible to start the image sensor 11 earlier to capture the first image so that the first image is processed faster and more efficiently when performing the image processing program.

Figure 2A:
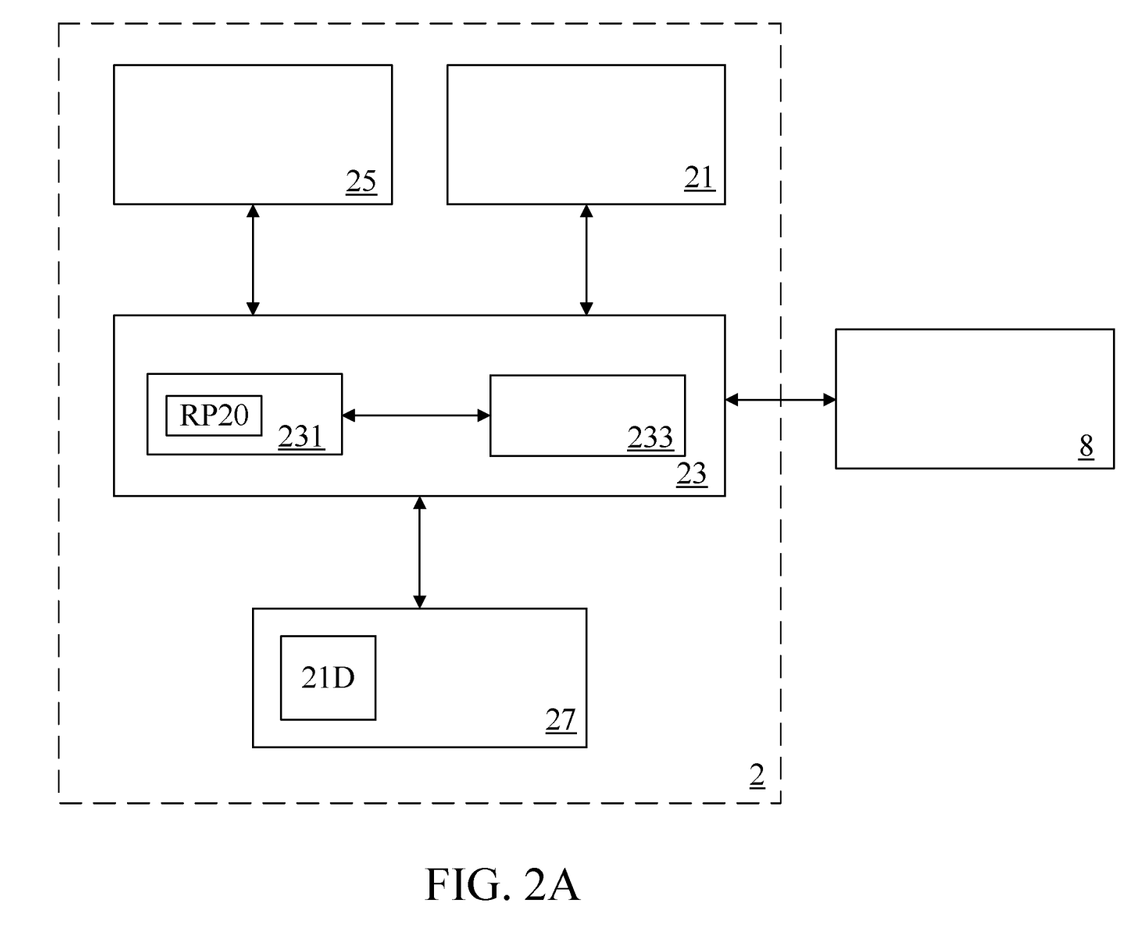
FIG. 2A is a block diagram illustrating an image capturing system 1 according to some embodiments of the present disclosure.

Please refer to FIG. 2A, which is a block diagram illustrating an image capturing system 2 according to some embodiments of the present disclosure. The image capturing system 2 includes an image sensor 21, an imaging SoC 23, a sensor 25, and a non-read-only memory 27. The imaging SoC 23 includes a memory (e.g., a read-only memory (ROM) 231) and a controller 233. The ROM 231 stores a process data RP20. The non-read-only memory 27 stores an image sensor data 21D related to the image sensor 21.

In some embodiments, the image sensor 21, the sensor 25 and the non-read-only memory 27 and the imaging SoC 23 are electrically connected, and the ROM 231 and the controller 233 are electrically connected. In some embodiments, the imaging SoC 23 and a non-read-only memory 8 are electrically connected. Data and signals are transmitted between elements via the electrical connection. Related image capturing operations are discussed in detail below.

Figure 2B:
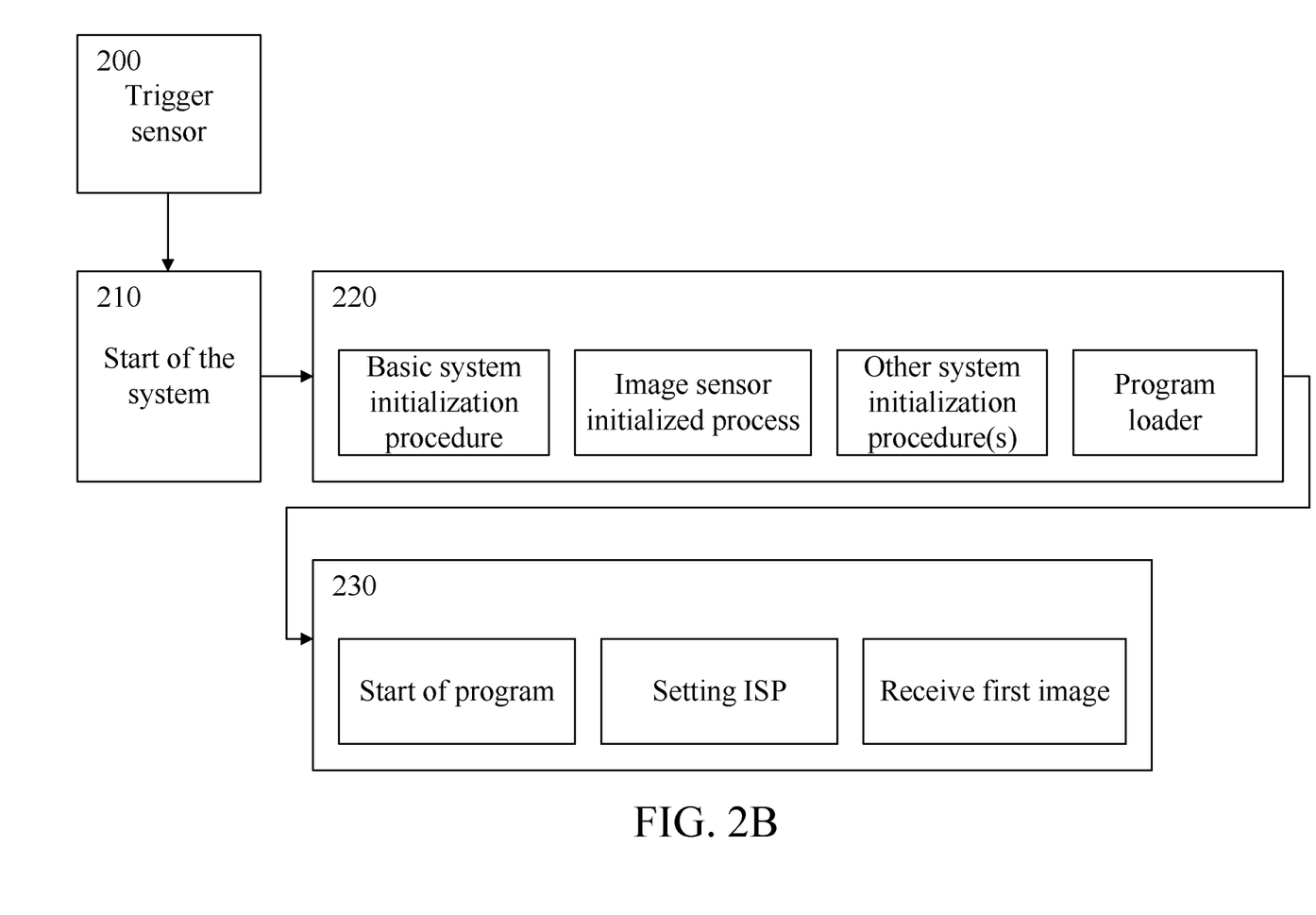
FIG. 2B is a schematic diagram showing the operation sequences of the image capturing system in different stages according to some embodiments of the present disclosure.

Please refer to FIG. 2B together. FIG. 2B is a schematic diagram showing the operation sequences of the image capturing system 2 in different stages according to some embodiments of the present disclosure. The block 200 represents the operations during "event occurrence and triggering the sensor 25 to wake the image capturing system 2" stage, the block 210 represents the operations during "the start of the image capturing system 2" stage, the block 220 represents the operations during "the processing of the process data RP20 stored in the ROM 231" stage, and the block 230 represents the operations during "the processing of the data loaded in the non-read-only memory 8" stage.

Specifically, during the stage of the block 200, the sensor 25 is configured to monitor the occurrence of events (e.g., movement of objects or turning on a switch). After the sensor 25 detects such events, a trigger signal is generated, and the trigger signal is transmitted to the imaging SoC 23 to wake the imaging SoC 23. On the other hand, after the controller 233 of the imaging SoC 23 detects the trigger signal, it proceeds to the stage of the block 210, during which the image capturing system 2 is started.

When the image capturing system 2 is started and the image capturing processes begin, it proceeds to the stage of the block 220, during which the controller 233 of the imaging SoC 23 reads the process data RP20 of the ROM 231 based on the operation of the system started by the trigger signal. In some embodiments, the process data RP20 includes a basic system initialization procedure, an image sensor initialized process, other system initialization procedure(s), and a program loader.

In some embodiments, the controller 233 of the imaging SoC 23, according to the process data RP20 of the ROM 231, sequentially performs: (1) the basic system initialization procedure, configured to initialize the system; (2) the image sensor initialized process, configured to start the image sensor 21, and control the image sensor 21 to capture the first image; (3) other system initialization procedure(s), configured to further complete the system initialization; (4) program loader, configured to load an image processing program into the non-read-only memory 8.

In some embodiments, when the controller 233 of SoC 23 performs the image sensor initialized process, and the controller 233 of the SoC 23 reads the image sensor data 21D related to the image sensor 21 from the non-read-only memory 27. The image sensor data 21D includes a plurality of programmable control commands and a plurality of parameters corresponding to the control commands.

In detail, since the image sensor 21 of different types or specifications can be operated by various combinations of control commands, and each control command needs to be executed with parameters, users can write the corresponding image sensor data 21D into the non-read-only memory 27 for the specifications and types of the image sensor 21, so that the controller 233B of the SoC 23 can use such data when performing the image sensor initialized process.

Thereafter, when the image processing program is loaded into the non-read-only memory 8, it proceeds to the stage of the block 230, during which the controller 233 of the imaging SoC 23 sequentially performs: (1) program start, configured to operate the start of each module of the imaging SoC 23; (2) setting the configuration of the image signal processor (ISP); (3) receiving the first image.

In this way, by performing the image sensor initialized process in advance during the procedures related to the process data RP20 stored in the ROM 231, it is feasible to start the image sensor 21 earlier to capture the first image. In this way, the first image is processed faster and more efficiently when performing the image processing program. Additionally, the user may write corresponding image sensor data 21D into the non-read-only memory 27 in advance according to the specification or type of the image sensor 21, so as to increase the system's flexibility.

In some embodiments, the non-read-only memory 8 includes a random access memory (RAM), and the non-read-only memory 27 includes a flash memory. In some embodiments, the sensor 25 includes an environment sensor (e.g., motion sensor, infrared motion sensor) or a switch, and a trigger signal is generated when the environment sensor detects an event (e.g., detecting an object movement), or when the switch detects an event (e.g., turning on the switch).

In some embodiments, the imaging SoC 23 is electrically connected to the image sensor 21 via a general-purpose input/output (GPIO) interface or an inter-integrated circuit (I$^2$C) interface. The controller 233 of the imaging SoC 23 can control the image sensor 21 respectively via the GPIO or the I$^2$C interface. The I$^2$C supports the direct memory access (DMA) mode, thereby increasing the efficiency of the controller 233 of the imaging SoC 23.

Figure 3A:
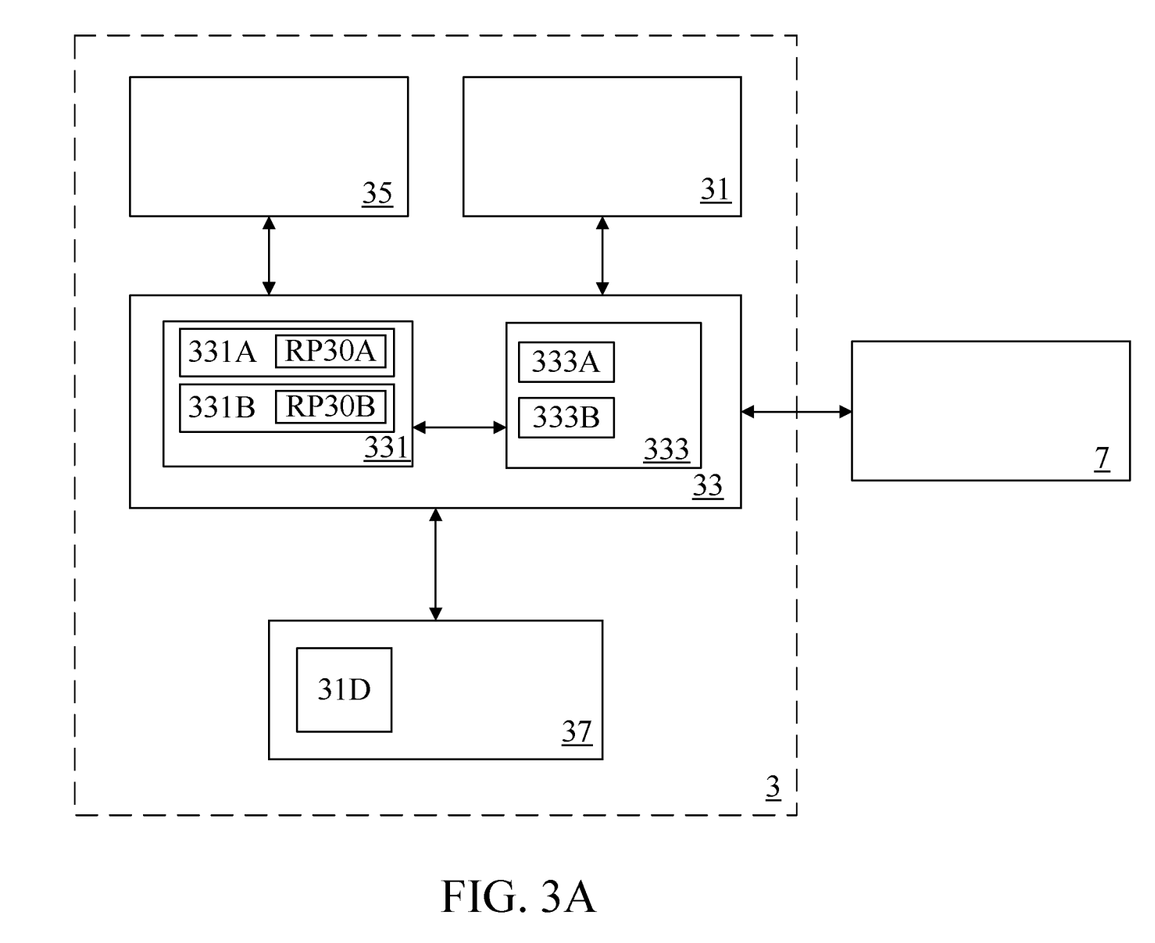
FIG. 3A is a block diagram illustrating an image capturing system 1 according to some embodiments of the present disclosure.

Please refer to FIG. 3A, which is a block diagram illustrating an image capturing system 3 according to some embodiments of the present disclosure. The image capturing system 3 including an image sensor 31, an imaging SoC 33, a sensor 35, and a non-read-only memory 37. The imaging SoC 33 includes a memory set (e.g., a ROM set 331) and a controller set 333. The ROM set 331 stores a process data. The non-read-only memory 37 stores and an image sensor data 31D related to the image sensor 31.

In some embodiments, the ROM set 331 includes a ROM 331A and a ROM 331B, and the controller set 333 includes a controller 333A corresponding to the ROM 331A and a controller 333B corresponding to the ROM 331B. The ROM 331A stores a portion of the RP30A of the process data, and the ROM 331B stores a portion of the RP30B of the process data.

In some embodiments, the image sensor 31, the sensor 35 and the non-read-only memory 37 and the imaging SoC 33 are electrically connected, and the ROM set 331 and the controller set 333 are electrically connected. In some embodiments, the imaging SoC 33 and a non-read-only memory 7 are electrically connected. Data and signals are transmitted between elements via the electrical connection. Related image capturing operations are discussed in detail below.

Figure 3B:
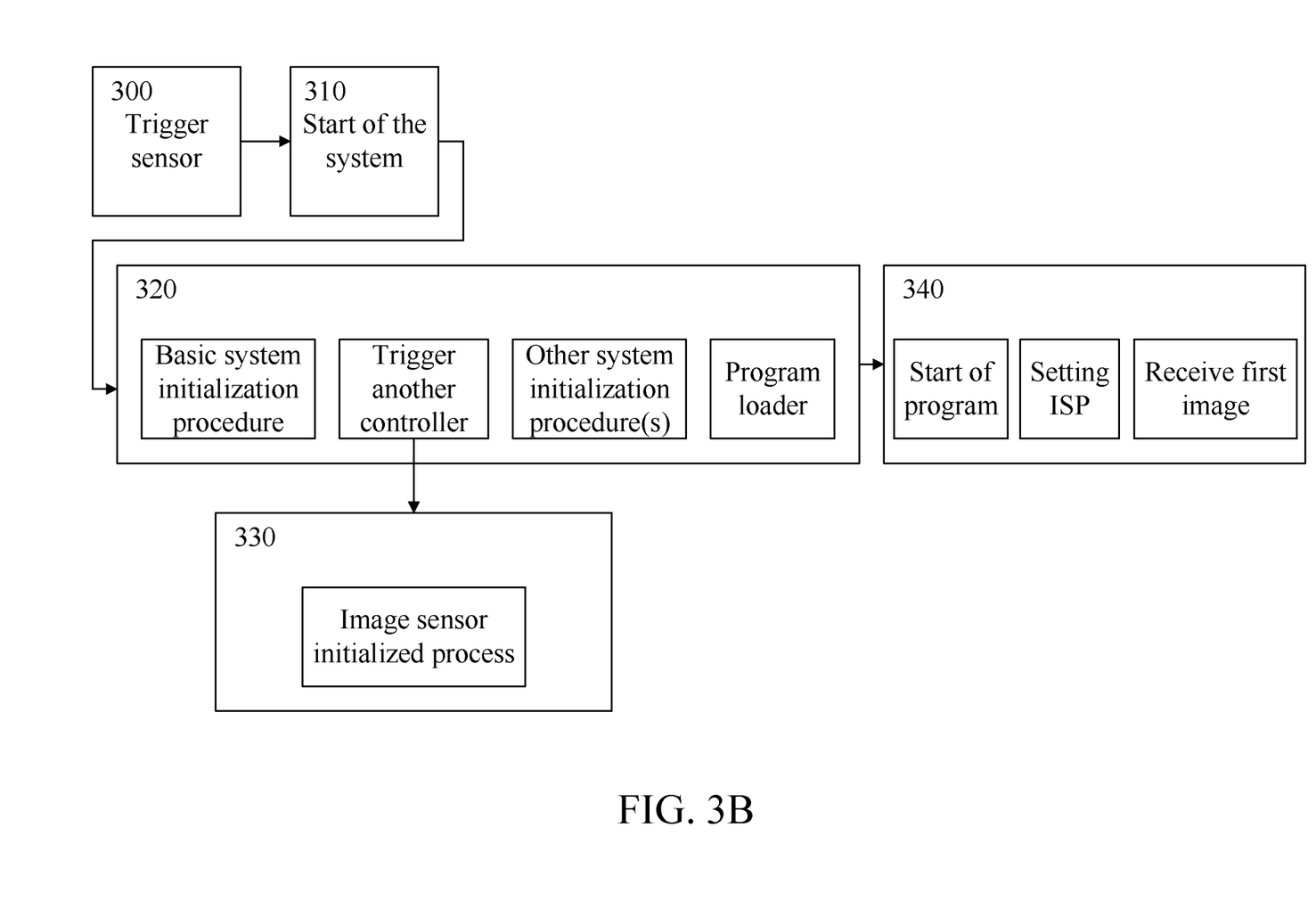
FIG. 3B is a schematic diagram showing the operation sequences of the image capturing system in different stages according to some embodiments of the present disclosure.

Please refer to FIG. 3B together. FIG. 3B is a schematic diagram showing the operation sequences of the image capturing system 3 in different stages according to some embodiments of the present disclosure. The block 300 represents the operations during "event occurrence and triggering the sensor 35 to wake the image capturing system 3" stage, the block 310 represents the operations during "the start of the image capturing system 3" stage, the block 320 represents the operations during "the processing of the process data RP30A stored in the ROM 331A" stage, the block 330 represents the operations during "the processing of the process data RP30B stored in the ROM 331B" stage, and the block 340 represents the operations during "the processing of the data loaded in the non-read-only memory 7" stage.

Specifically, during the stage of the block 300, the sensor 35 is configured to monitor the occurrence of events (e.g., movement of objects or turning on a switch). After the sensor 35 detects such events, a trigger signal is generated, and the trigger signal is transmitted to the imaging SoC 33 to wake the imaging SoC 33. On the other hand, after the controller 333A of the imaging SoC 33 detects the trigger signal, it proceeds to the stage of the block 310, during which the image capturing system 3 is started.

When the image capturing system 3 is started and the image capturing processes begin, it proceeds to the stage of the block 320, during which the controller 333A of the imaging SoC 33 reads the process data RP30A of the ROM 331 based on the operation of the system started by the trigger signal. In some embodiments, the process data RP30A includes a basic system initialization procedure, an image sensor initialized process, other system initialization procedure(s), and a program loader.

In some embodiments, the controller 333A of the imaging SoC 33, according to the process data RP30A of the ROM 331, sequentially performs: (1) the basic system initialization procedure, configured to initialize the system; (2) triggering another controller procedure, configured to trigger the controller 333B; (3) other system initialization procedure(s), configured to further complete the system initialization; (4) program loader, configured to load an image processing program into the non-read-only memory 7.

In some embodiments, after the controller 333B of the imaging SoC 33 is triggered, it proceeds to the stage of the block 330, during which the controller 333B reads the process data RP30B of the ROM 331B. The process data RP30B includes an image sensor initialized process. Therefore, the controller 333B of the imaging SoC 33 performs the image sensor initialized process according to the process data RP30B of the ROM 331B, so as to start the image sensor 31, and controls the image sensor 31 to capture the first image.

In some embodiments, when the controller 333B of SoC 33 performs the image sensor initialized process, and the controller 333B reads the image sensor data 31D related to the image sensor 31 from the non-read-only memory 37. The image sensor data 31D includes a plurality of programmable control commands and a plurality of parameters corresponding to the control commands.

In detail, since the image sensor 31 of different types or specifications can be operated by different combinations of control commands, and each control command needs to be executed with parameters, users can write the corresponding image sensor data 31D into the non-read-only memory 37 for the specifications and types of the image sensor 31, so that the controller 333B of the SoC 33 can use such data when performing the image sensor initialized process.

Thereafter, when the image processing program is loaded into the non-read-only memory 7, it proceeds to the stage of the block 340, during which the controller 333A of the imaging SoC 33 sequentially performs: (1) program start, configured to operate the start of each module of the imaging SoC 33; (2) setting the configuration of the ISP; (3) receiving the first image.

In this way, it is feasible to speed up the overall operation speed of the system by arranging multiple pairs of controller and ROM so as to perform multiple procedures in a decentralized manner. Further, by performing the image sensor initialized process in advance during the procedures related to the process data RP30B stored in the ROM 331B, it is feasible to start the image sensor 31 earlier to capture the first image. In this way, the first image is processed faster and more efficiently when performing the image processing program. Additionally, the user may write corresponding image sensor data 31D into the non-read-only memory 37 in advance according to the specification or type of the image sensor 31, so as to increase the system's flexibility.

Figure 3C:
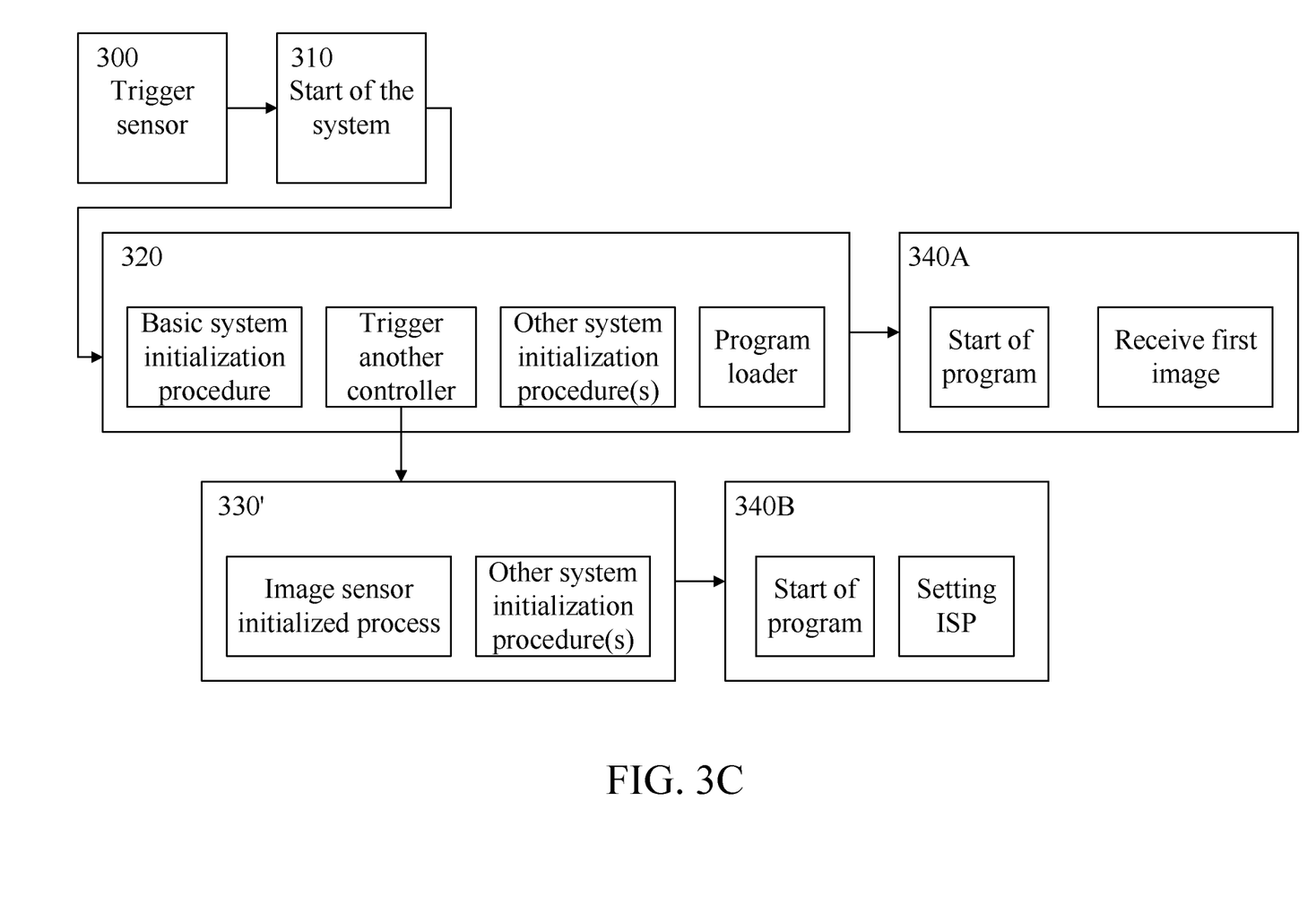
FIG. 3C is a schematic diagram showing the operation sequences of the image capturing system in different stages according to some embodiments of the present disclosure.

Please refer to FIG. 3C together. FIG. 3C is a schematic diagram showing another operation sequence of the image capturing system 3 in different stages according to some embodiments of the present disclosure. The block 300 represents the operations during "event occurrence and triggering the sensor 35 to wake the image capturing system 3" stage, the block 310 represents the operations during "the start of the image capturing system 3" stage, the block 320 represents the operations during "the processing of the process data RP30A stored in the ROM 331A" stage, the block 330' represents the operations during "the processing of the process data RP30B stored in the ROM 331B" stage, and the block 340 represents the operations during "the processing of the data loaded in the non-read-only memory 7" stage.

In some embodiments, after the controller 333B of the imaging SoC 33 is triggered, it proceeds to the stage of the block 330', during which the controller 333B reads the process data RP30B of the ROM 331B. The process data RP30B includes an image sensor initialized process and another other system initialization procedure. After the controller 333B of the imaging SoC 33 is triggered, the controller 333B reads the process data RP30B of the ROM 331B. According to the process data RP30B of the ROM 331B, the controller 333B of the imaging SoC 33 sequentially performs: (1) image sensor initialized process, configured to start the image sensor 31, and control the image sensor 31 to capture the first image; (2) another other system initialization procedure, configured to further complete the system initialization.

In some embodiments, when the image processing program is loaded into the non-read-only memory 7, it proceeds to the stage of the block 340A and the stage of the block 340B. During the stage of the block 340A, the controller 333A of the imaging SoC 33 sequentially performs: (1) program start, configured to operate the start of modules controlled by the controller 333A of the imaging SoC 33; (2) receiving the first image.

During the stage of the block 340B, the controller 333B of the imaging SoC 33 sequentially performs: (1) program start, configured to operate the start of modules controlled by the controller 333B of the imaging SoC 33; (2) setting the configuration of the ISP. It should be noted that, in some embodiments, the step of receiving the first image in the block 340A only takes place after the step of setting the configuration of the ISP in the block 340B is completed.

Figure 4:
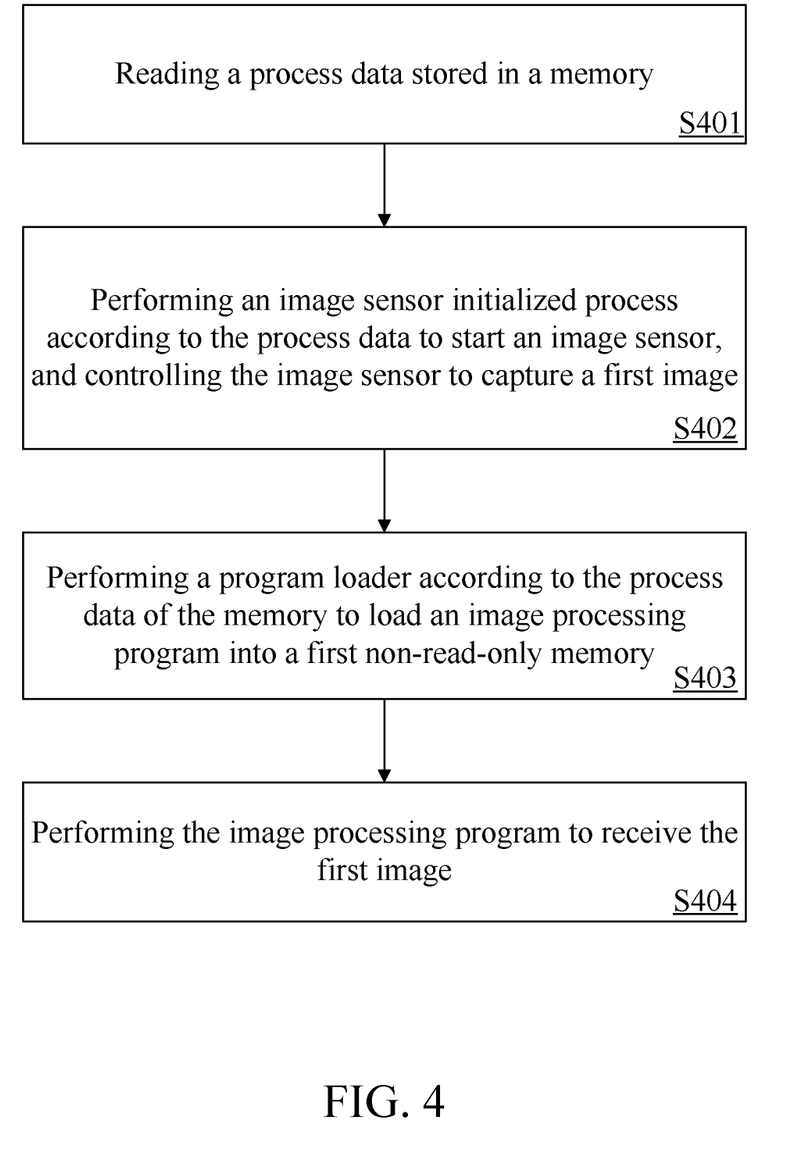
FIG. 4 is a flowchart of an image capturing method of according to some embodiments of the present disclosure.

Some embodiments of the present disclosure include image capturing method, which is shown in the flow chart of FIG. 4. Image capturing method according to these embodiment can be implemented by an image capturing system and an imaging SoC (such as image capturing systems and imaging SoCs described in the foregoing embodiments). Detailed operations of these methods are discussed below.

First, step S401 is executed to read a process data stored in a memory (e.g. a ROM). Step S402 is executed to perform an image sensor initialized process according to the process data of the memory to start an image sensor, and to control the image sensor to capture a first image. Step S403 is executed to perform, after performing the image sensor initialized process, a program loader according to the process data of the memory, so as to load an image processing program into a first non-read-only memory. Step S404 is executed to perform the image processing program to receive the first image.

Figure 5:
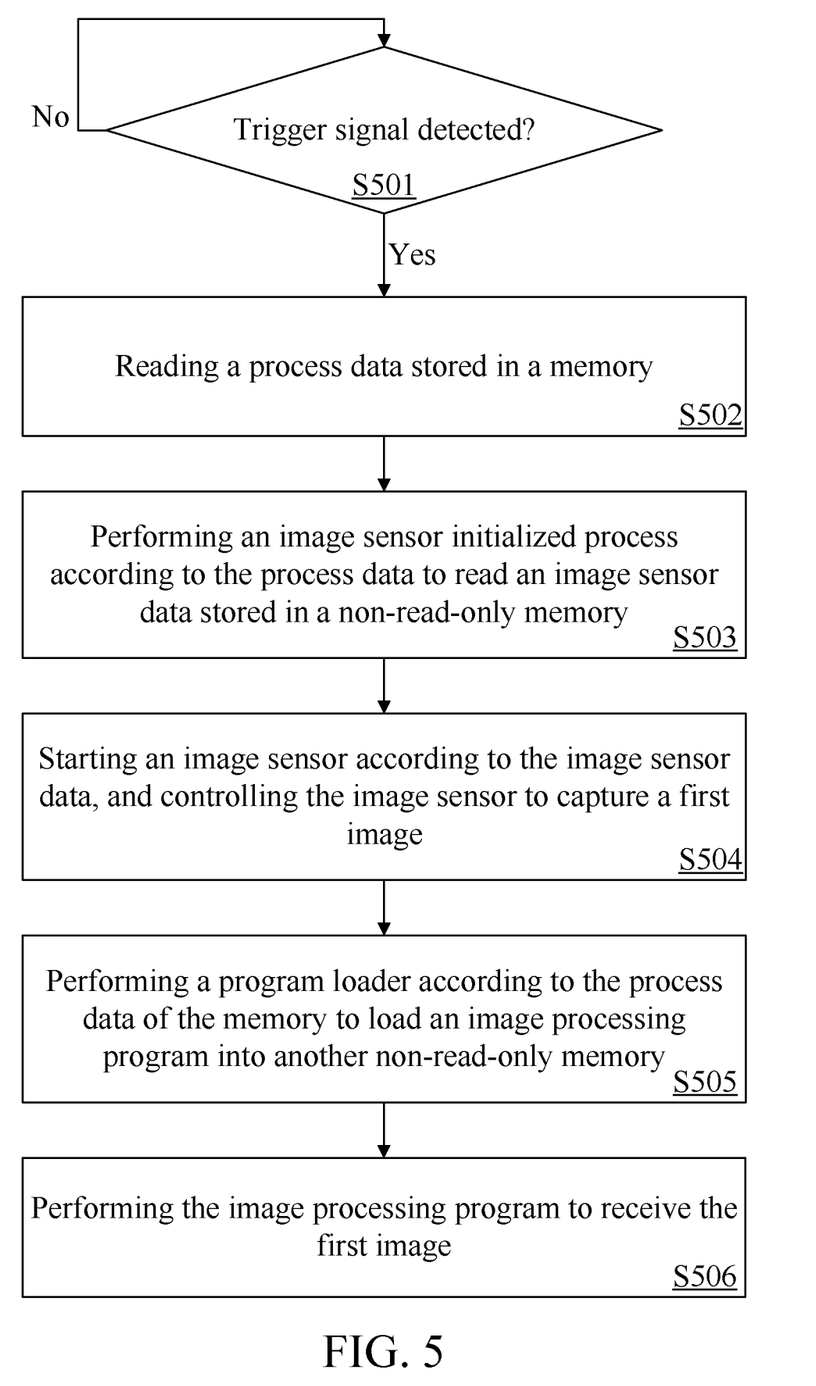
FIG. 5 is a flowchart of an image capturing method of according to some embodiments of the present disclosure.

Some embodiments of the present disclosure include image capturing method, which is shown in the flow chart of FIG. 5. Image capturing method according to these embodiments can be implemented by an image capturing system and an imaging SoC (such as image capturing systems and imaging SoCs described in the foregoing embodiments). Detailed operations of these methods are discussed below.

First, step S501 is executed to detect a trigger signal. If no trigger signal is detected, then, step S501 is repeated. If a trigger signal is detected, then step S502 is executed to read a process data stored in a memory (e.g. a ROM). The trigger signal is generated by a sensor. The sensor includes an environment sensor or a switch.

Step S503 is executed to perform an image sensor initialized process according to the process data of the memory to read an image sensor data stored in a non-read-only memory (e.g., a flash memory). The image sensor data includes a plurality of control commands and a plurality of parameters corresponding to these control commands. Step S504 is executed to start an image sensor according to the image sensor data, and to control the image sensor to capture a first image.

Step S505 is executed to perform, after executing the image sensor initialized process, a program loader according to the process data of the memory, so as to load an image processing program into another non-read-only memory (e.g., a RAM). Step S506 is executed to perform the image processing program to receive the first image.

Figure 6:
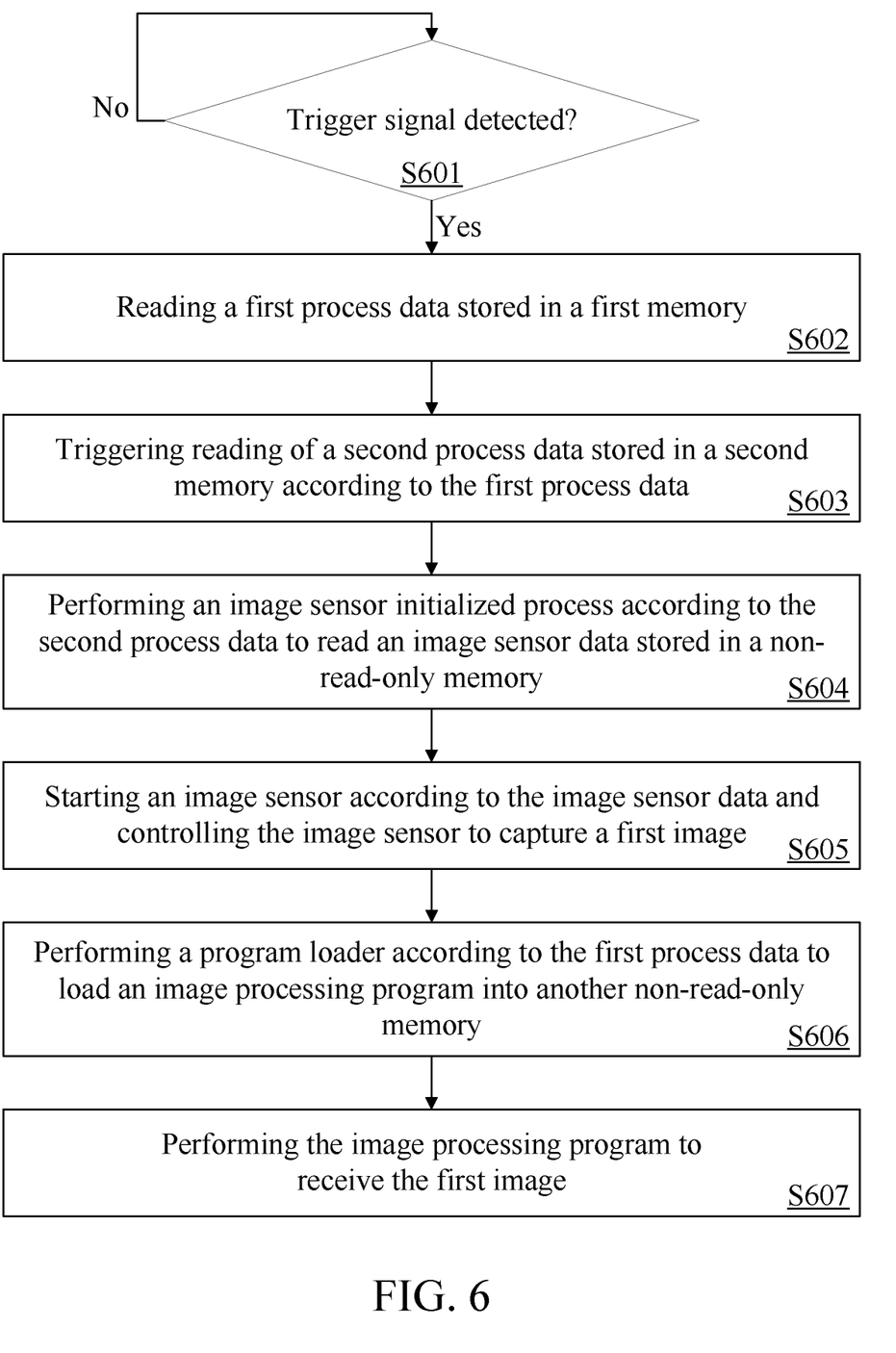
FIG. 6 is a flowchart of an image capturing method of according to some embodiments of the present disclosure.

Some embodiments of the present disclosure include image capturing method, which is shown in the flow chart of FIG. 6. Image capturing method according to these embodiment can be implemented by an image capturing system and an imaging SoC (such as image capturing systems and imaging SoCs described in the foregoing embodiments). Detailed operations of these methods are discussed below.

First, in step S601 is executed to detect a trigger signal. If no trigger signal is detected, then, step S601 is repeated. If a trigger signal is detected, then step S602 is executed to read a first process data stored in a first memory (e.g., a ROM). The trigger signal is generated by a sensor. The sensor includes an environment sensor or a switch.

Step S603 is executed to trigger reading of a second process data stored in a second memory (e.g., a ROM) according to the first process data of the first memory. Step S604 is executed to perform an image sensor initialized process according to the second process data of the second memory to read an image sensor data stored in a non-read-only memory (e.g., a flash memory). The image sensor data includes a plurality of control commands and a plurality of parameters corresponding to these control commands. Step S605 is executed to start an image sensor according to the image sensor data, and to control the image sensor to capture a first image.

Step S606 is executed to perform, after performing the image sensor initialized process, a program loader according to the first process data of the memory, so as to load an image processing program into another non-read-only memory (e.g., a RAM). Then, S607 is executed to perform the image processing program to receive the first image.

In view of the foregoing, the present disclosure provides an imaging SoC, image capturing system including said imaging SoC, and a method for capturing image, which can activate the image sensor in advance, thereby significantly reducing the time delay for capturing the first image, so as to complete the capturing of the first image in a more efficient and speedy way. As should be noted, in some embodiments, the above-mentioned imaging SoC may have a controller that includes a logic circuit capable of executing computation and commands; however, this is not a limitation to the implementation of the hardware components of the present disclosure.

While this invention has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the invention by simply employing the elements of the independent claims. Accordingly, embodiments of the invention as set forth herein are intended to be illustrative, not limiting. Various changes may be made without departing from the spirit and scope of the invention.

What is claimed is:

1. A method for capturing image, comprising:
    reading a process data stored in a memory;
    performing an image sensor initialized process to start an image sensor according to the process data, and controlling the image sensor to capture a first image;
    performing a program loader according to the process data, after performing the image sensor initialized process and controlling the image sensor to capture the first image, to load an image processing program into a first non-read-only memory; and
    performing the image processing program to receive the first image captured before performing the image processing program.

2. The method for capturing image of claim 1, wherein, the step of performing the image sensor initialized process further comprises:
    reading an image sensor data of a second non-read-only memory; and
    starting the image sensor according to the image sensor data.

3. The method for capturing image of claim 2, wherein the image sensor data comprises a plurality of control commands and a plurality of parameters corresponding to the plurality of control commands.

4. The method for capturing image of claim 2, wherein, the first non-read-only memory comprises a random access memory (RAM), and the second non-read-only memory comprises a flash memory.

5. The method for capturing image of claim 1, further comprising:
    detecting a trigger signal;
    wherein, the step of reading the process data further comprises:
    reading the process data based on the trigger signal.

6. The method for capturing image of claim 5, wherein the trigger signal is generated by a sensor, and the sensor comprises an environment sensor or a switch.

7. An imaging system on chip (SoC), comprising:
    a memory set, configured to store a process data; and
    a controller set, electrically connected to the memory set and configured to:
        read the process data;
        perform an image sensor initialized process to start an image sensor according to the process data, and control the image sensor to capture a first image;
        perform a program loader according to the process data, after performing the image sensor initialized process and controlling the image sensor to capture the first image, to load an image processing program into a first non-read-only memory; and
        perform the image processing program to receive the first image captured before performing the image processing program.

8. The imaging SoC of claim 7, wherein the memory set comprises a first memory, wherein the first memory stores the process data, and the controller set comprises a first controller corresponding to the first memory.

9. The imaging SoC of claim 8, wherein the first controller configured to:
    read the process data;
    perform the image sensor initialized process to start the image sensor according to the process data of the first memory;
    perform the program loader according to the process data of the first memory, after perform the image sensor initialized process, to load the image processing program into the first non-read-only memory; and
    perform the image processing program to receive the first image.

10. The imaging SoC of claim 9, wherein performing the image sensor initialized process further comprises:
    reading, by the first controller, an image sensor data of a second non-read-only memory; and
    starting, by the first controller, the image sensor according to the image sensor data.

11. The imaging SoC of claim 10, wherein, the image sensor data comprises a plurality of control commands and a plurality of parameters corresponding to the plurality of control commands.

12. The imaging SoC of claim 7, wherein the memory set comprises a first memory and a second memory, the first memory stores a portion of the process data, the second memory stores a portion of the process data, the controller set comprises a first controller corresponding to the first memory, and a second controller corresponding to the second memory.

13. The imaging SoC of claim 12, wherein performing, by the controller set, the image sensor initialized process according to the process data further comprises:
    triggering the second controller by the first controller; and
    performing, by the second controller, the image sensor initialized process according to a portion of the process data of the second memory to activate the image sensor.

14. The imaging SoC of claim 13, wherein performing the image sensor initialized process further comprises:
    reading, by the second controller, an image sensor data of a second non-read-only memory;
    starting, by the second controller, the image sensor according to the image sensor data.

15. The imaging SoC of claim 14, wherein, the image sensor data comprises a plurality of control commands and a plurality of parameters corresponding to the plurality of control commands.

16. An image capturing system, comprising:
    an image sensor; and
    an imaging system on chip (SoC), electrically connected to the image sensor and comprising:
        a memory, configured to store a process data;
        a controller, electrically connected to the memory and configured to:
            read the process data;
            perform an image sensor initialized process to start the image sensor according to the process data, and control the image sensor to capture a first image;
            perform a program loader according to the process data, after performing the image sensor initialized process and controlling the image sensor to capture the first image, to load an image processing program into a first non-read-only memory; and perform the image processing program to receive the first image captured before performing the image processing program.

17. The image capturing system of claim 16, further comprising:

a second non-read-only memory, electrically connected to the imaging SoC and configured to store an image sensor data;

wherein, the controller is further configured to:

read the image sensor data of the second non-read-only memory; and start the image sensor according to the image sensor data.

18. The image capturing system of claim 17, wherein, the second non-read-only memory comprise a flash memory.

19. The image capturing system of claim 16, further comprising:

a sensor, electrically connected to the imaging SoC and configured to generate a trigger signal;

wherein, the controller is further configured to:

detect the trigger signal; and read the process data based on the trigger signal.

20. The image capturing system of claim 16, wherein, the imaging SoC is electrically connected to the image sensor via a general-purpose input/output (GPIO) or an inter-integrated circuit (I2C).

* * * * *